(12) United States Patent
Kitamura et al.

(10) Patent No.: US 8,396,432 B2
(45) Date of Patent: Mar. 12, 2013

(54) TRANSMITTER CIRCUIT AND COMMUNICATION APPARATUS

(75) Inventors: Ryo Kitamura, Kanagawa (JP); Kaoru Ishida, Kanagawa (JP); Mikihiro Shimada, Osaka (JP); Hiroshi Komori, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/381,240

(22) PCT Filed: Apr. 1, 2010

(86) PCT No.: PCT/JP2010/002417
§ 371 (c)(1),
(2), (4) Date: Dec. 28, 2011

(87) PCT Pub. No.: WO2011/001576
PCT Pub. Date: Jan. 6, 2011

(65) Prior Publication Data
US 2012/0108187 A1    May 3, 2012

(30) Foreign Application Priority Data

Jul. 1, 2009   (JP) ................................. 2009-156552

(51) Int. Cl.
*H04B 1/04* (2006.01)
(52) U.S. Cl. .................. 455/110; 455/127.1; 455/127.2; 455/127.3; 455/108
(58) Field of Classification Search .................. 455/110, 455/127.2, 127.1, 108, 127.3
See application file for complete search history.

(56) References Cited

U.S. PATENT DOCUMENTS

| | | | | |
|---|---|---|---|---|
| 7,450,915 | B1 * | 11/2008 | Groe | 455/127.2 |
| 7,859,459 | B2 * | 12/2010 | McCune, Jr. | 342/372 |
| 7,937,049 | B2 * | 5/2011 | Phillips et al. | 455/114.3 |
| 8,155,604 | B2 * | 4/2012 | Rofougaran | 455/102 |
| 8,269,558 | B1 * | 9/2012 | Keese et al. | 330/285 |
| 2003/0107433 | A1 | 6/2003 | Arai et al. | |

(Continued)

FOREIGN PATENT DOCUMENTS

| | | |
|---|---|---|
| JP | 2003-243994 | 8/2003 |
| JP | 2005-45817 | 2/2005 |

(Continued)

OTHER PUBLICATIONS

International Search Report issued Jul. 6, 2010 in corresponding International Application No. PCT/JP2010/002417.

(Continued)

*Primary Examiner* — Sanh Phu
(74) *Attorney, Agent, or Firm* — Wenderoth, Lind & Ponack, L.L.P.

(57) ABSTRACT

A transmitter circuit is provided which is capable of reducing modulation distortion even when an output power of a power amplifying section 141 is low. A signal generation section 11 generates an amplitude signal and a phase signal. A regulator 12 outputs a current based on the amplitude signal. A phase modulation section 13 phase-modulates the phase signal, and outputs a phase-modulated signal. The power amplifying section 141 receives the current which is based on the amplitude signal and supplied as a bias current from the regulator 12, and amplifies the phase-modulated signal by using the supplied current. Further, to the power amplifying section 141, a predetermined DC voltage is supplied as a collector voltage.

14 Claims, 17 Drawing Sheets

U.S. PATENT DOCUMENTS

| | | |
|---|---|---|
| 2005/0017800 A1 | 1/2005 | Robinson |
| 2005/0151586 A1 | 7/2005 | Grillo et al. |
| 2005/0245214 A1 | 11/2005 | Nakamura et al. |
| 2008/0175335 A1 | 7/2008 | Morimoto et al. |
| 2009/0315620 A1 | 12/2009 | Yamanouchi et al. |

FOREIGN PATENT DOCUMENTS

| | | |
|---|---|---|
| JP | 2005-513943 | 5/2005 |
| JP | 2005-295523 | 10/2005 |
| JP | 2008-206142 | 9/2008 |
| WO | 2008/078565 | 7/2008 |

OTHER PUBLICATIONS

F. H. Raab et al., "High-Efficiency L-Band Kahn-Technique Transmitter", IEEE MTT-S Int. Microwave Symp. Dig., Jun. 1998, pp. 585-588.

* cited by examiner

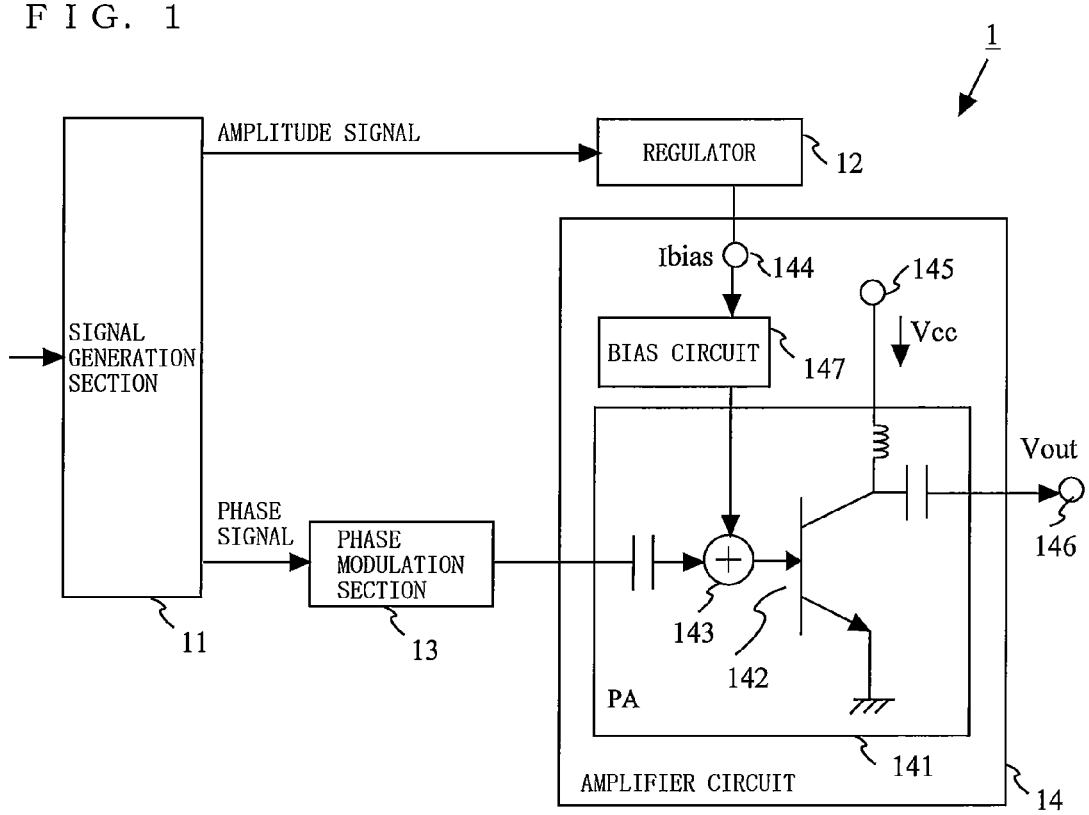

FIG. 6

| TEMPERATURE INFORMATION T | COEFFICIENT $\alpha$ |
|---|---|
| T1 | $\alpha 1$ |
| T2 | $\alpha 2$ |
| T3 | $\alpha 3$ |
| T4 | $\alpha 4$ |
| T5 | $\alpha 5$ |
| ⋮ | ⋮ |

| POWER INFORMATION P | POINTS TO WHICH SWITCHES 27 AND 150 ARE TO BE CONNECTED |
|---|---|
| P1 | TO BE CONNECTED TO TERMINAL P |
| P2 | TO BE CONNECTED TO TERMINAL C |
| P3 | TO BE CONNECTED TO TERMINAL C |
| P4 | TO BE CONNECTED TO TERMINAL C |
| P5 | TO BE CONNECTED TO TERMINAL C |
| ⋮ | ⋮ |

FIG. 9B

| POWER INFORMATION P | OPERATION MODE |
|---|---|
| P1 | FIRST MODE |
| P2 | SECOND MODE |
| P3 | SECOND MODE |
| P4 | SECOND MODE |
| P5 | SECOND MODE |
| ⋮ | ⋮ |

US 8,396,432 B2

TRANSMITTER CIRCUIT AND COMMUNICATION APPARATUS

TECHNICAL FIELD

The present invention relates to transmitter circuits for use in communication apparatuses such as mobile telephones and wireless LANs, and more particularly to transmitter circuits that operate with enhanced accuracy and enhanced efficiency, and communication apparatuses using the same.

BACKGROUND ART

In an advanced information society in recent years, communication apparatuses such as mobile telephones and wireless LANs are required to ensure linearity of transmission signals in wide power amplification ranges, and to operate with reduced power consumption. For such communication apparatuses, transmitter circuits that output highly accurate transmission signals regardless of bandwidths, and that operate with enhanced efficiency are used. Hereinafter, conventional transmitter circuits will be described.

As conventional transmitter circuits, for example, transmitter circuits (hereinafter, referred to as quadrature modulation circuits) that generate transmission signals by using a modulation mode such as the quadrature modulation mode have been known. The quadrature modulation circuits are well-known. Therefore, the description thereof is omitted. Further, as conventional transmitter circuits that operate with higher efficiency than the quadrature modulation circuits, for example, a transmitter circuit 500 shown in FIG. 14 has been known (see, for example, Non-Patent Literature 1). FIG. 14 is a block diagram illustrating a configuration of the conventional transmitter circuit 500 disclosed in Non-Patent Literature 1. In FIG. 14, the conventional transmitter circuit 500 includes a signal generation section 501, a regulator 502, a phase modulation section 503, and an amplifier circuit 504. The amplifier circuit 504 includes a power amplifying section 505, a base bias terminal 509, and a collector terminal 510.

In the conventional transmitter circuit 500, the signal generation section 501 generates an amplitude signal and a phase signal. The amplitude signal is inputted to the regulator 502. The regulator 502 supplies, to the amplifier circuit 504, a voltage based on the inputted amplitude signal. The regulator 502 typically supplies, to the amplifier circuit 504, a voltage proportional to a magnitude of the inputted amplitude signal.

On the other hand, the phase signal is inputted to the phase modulation section 503. The phase modulation section 503 subjects the phase signal to phase modulation, to output a phase-modulated signal. The amplifier circuit 504 amplifies the phase-modulated signal having been inputted from the phase modulation section 503, according to the voltage supplied from the regulator 502, to output a resultant signal as a modulated signal. The modulated signal is outputted as a transmission signal from an output terminal. The transmitter circuit 500 as described above is called a polar transmitter circuit.

Next, the amplifier circuit 504 will be described in detail. In the amplifier circuit 504, the power amplifying section 505 includes an amplifying transistor 506, a bias circuit 507, an adder 508, and the like. In the amplifier circuit 504, a DC voltage having a predetermined magnitude is supplied as a bias voltage Vbias to the base bias terminal 509. Further, a voltage based on the amplitude signal is supplied as a collector voltage Vcc to the collector terminal 510 from the regulator 502.

To the adder 508, the phase-modulated signal is inputted from the phase modulation section 503, and the bias voltage Vbias is inputted via the bias circuit 507. The adder 508 adds the bias voltage Vbias to the phase-modulated signal, to output a resultant signal to the amplifying transistor 506. The amplifying transistor 506 amplifies the phase-modulated signal inputted via the adder 508, to output a resultant signal as a transmission signal through the output terminal.

Thus, in the conventional transmitter circuit 500, the bias voltage Vbias is supplied to the base bias terminal 509 for the power amplifying section 505, and the regulator 502 controls the collector voltage Vcc for the power amplifying section 505 according to the voltage based on the amplitude signal, thereby controlling an output power level.

Further, as a conventional transmitter circuit that controls a collector voltage Vcc (or a drain voltage) for the power amplifying section to control an output power level, a transmitter circuit 600 as shown in FIG. 15 is suggested (see, for example, Patent Literature 1). FIG. 15 is a block diagram illustrating a configuration of the conventional transmitter circuit 600. In FIG. 15, the transmitter circuit 600 mainly includes an amplitude-phase separation section 621, a power-source voltage control section 622, a bias voltage source 623, a power amplifying section 624, a coupler 625, a comparator 626, a switch SW1, and a switch SW2. The power amplifying section 624 includes power-amplifying FETs 6241 to 6243, and a bias circuit 6244.

The transmitter circuit 600 operates by switching between the GSMK (Gaussian filtered Minimum Shift Keying) mode and the EDGE (Enhanced Data Rates for GMS Evolution) mode, according to a mode signal MODE. Specifically, the switch SW1 and the switch SW2 are each switched according to the mode signal MODE so as to be connected to the (GSMK) side in a case where operation is to be performed in the GSMK mode, and connected to the (EDGE) side in a case where operation is to be performed in the EDGE mode.

In the operation according to the GSMK mode, the power-source voltage control section 622 controls a drain voltage Vdd to be supplied to the power-amplifying FETs 6241 to 6243, according to a power level control signal VPL. The bias voltage source 623 generates a bias voltage Vbias based on the drain voltage Vdd controlled by the power-source voltage control section 622. The bias circuit 6244 supplies a gate bias voltage based on the bias voltage Vbias, to gate terminals of the power-amplifying FETs 6241 to 6243.

In the operation according to the EDGE mode, the power-source voltage control section 622 controls the drain voltage Vdd to be supplied to the power-amplifying FETs 6241 to 6243, according to a signal LOD which is indicative of amplitude information of a transmission signal transmitted from the comparator 626. The phase-amplitude separator circuit 621 separates a communication signal into an amplitude signal Vin and a phase signal Pin. The comparator 626 compares the amplitude signal Vin from the phase-amplitude separator circuit 621, with a detection signal Vdt from the coupler 625 which is provided on the output side of the power amplifying section 624 for detecting an output level, to output a signal based on a difference in potential therebetween. The output from the coupler 625 is frequency-converted by a mixer MIX, and supplied as the detection signal Vdt to the comparator 626 via a filter FLT and an amplifier AMP.

Thus, in the conventional transmitter circuit 600, the gate bias voltage is supplied to the gate terminal of the power amplifying section 624, and the power-source voltage control section 622 controls the drain voltage Vdd for the power amplifying section 624, to control an output power level.

CITATION LIST

Patent Literature

Patent Literature 1: Japanese Laid-Open Patent Publication No. 2003-243994

Non Patent Literature

Non-Patent Literature 1: F. H. Raab, et al, "High-efficiency L-band Kahn-technique transmitter", 1998 IEEE MTT-S Int. Microwave Symp. Dig.

SUMMARY OF THE INVENTION

Problems to be Solved by the Invention

In some of the conventional transmitter circuits 500, switching is performed so as to control whether the power amplifying section 504 is to operate in a compressed mode or in an uncompressed mode, thereby ensuring a dynamic range of transmission power. The compressed mode may be also referred to as a saturated operation mode, whereas the uncompressed mode may be also referred to as an unsaturated operation mode. The transmitter circuit 500 causes the power amplifying section 504 to operate in the compressed mode in a time period in which a transmission power is high and the power amplifying section 504 can be operated in a saturation range. On the other hand, the transmitter circuit 500 causes the power amplifying section 504 to operate in the uncompressed mode in a time period in which the transmission power is low and it is difficult to operate the power amplifying section 504 in the saturation range.

FIG. 16 illustrates an exemplary output power characteristic of the transmitter circuit 500 observed when switching between the compressed mode and the uncompressed mode is performed. In FIG. 16, the horizontal axis represents an output power of the power amplifying section 504, which is designated by power information P. The vertical axis represents an actual output power of the power amplifying section 504. The power information P is information indicative of a magnitude of transmission power required for communication with a base station, and the power information P is generated in a baseband circuit. For example, in a W-CDMA system, a transmission power control for transmission to and from the base station is performed at every time slot.

As shown in FIG. 16, in the conventional transmitter circuit 500, an output power in the compressed mode is relatively accurate when the switching between the compressed mode and the uncompressed mode is performed in the transmission power control. However, it is known that an output power in the uncompressed mode is susceptible to variation among individual devices, variation in AM offset, temperature change, and the like, and the output power is variable. A region of the variation is referred to as a drift region. Thus, the conventional transmitter circuit 500 has a problem that when an output power of the power amplifying section 504 is low, the collector voltage Vcc is also reduced, thereby increasing modulation distortion.

Further, the conventional transmitter circuit 600 also has a problem that, since the power-source voltage control section 622 controls the drain voltage Vdd for the power amplifying section 624, to control an output power level, when an output power of the power amplifying section 624 is low, the drain voltage Vdd is also reduced, thereby increasing modulation distortion, similarly to the conventional transmitter circuit 500.

Therefore, an object of the present invention is to make available a transmitter circuit that is capable of not only ensuring a dynamic range of an output power of a power amplifying section, but also reducing modulation distortion also in the case of the output power of the power amplifying section being low, and a communication apparatus using the same.

Solution of the Problems

The present invention is directed to a transmitter circuit for outputting a transmission signal. In order to attain the object mentioned above, the transmitter circuit of the present invention includes: a signal generation section for generating an amplitude signal and a phase signal; a regulator for outputting a current based on the amplitude signal; a phase modulation section for phase-modulating the phase signal, and outputting a phase-modulated signal; and an amplifier circuit for receiving the current that is based on the amplitude signal and supplied from the regulator, and amplifying the phase-modulated signal by using the supplied current. The amplifier circuit includes a power amplifying section for amplifying the phase-modulated signal. The power amplifying section includes: a first input terminal to which the phase-modulated signal is inputted; a second input terminal to which a bias current is supplied; and a third input terminal to which a predetermined DC voltage is supplied. The current based on the amplitude signal is supplied as the bias current to the second input terminal from the regulator when the power amplifying section amplifies the phase-modulated signal.

The amplifier circuit may include a plurality of the power amplifying sections which are connected in cascade. In this case, the current based on the amplitude signal is supplied as the bias current from the regulator to the second input terminal of at least one of the plurality of the power amplifying sections when the phase-modulated signal is amplified. Further, the predetermined DC voltage is supplied to the third input terminal of each of the plurality of the power amplifying sections when the phase-modulated signal is amplified.

The transmitter circuit may switch an operation mode of the power amplifying section between an uncompressed mode and a compressed mode, according to power information. In this case, the regulator supplies the current based on the amplitude signal to the second input terminal of the power amplifying section in the uncompressed mode. Further, the transmitter circuit further includes: a first DC power source for supplying a DC voltage to the third input terminal of the power amplifying section in the uncompressed mode; a second DC power source for supplying a DC voltage to the second input terminal of the power amplifying section in the compressed mode; a second regulator for supplying a voltage based on the amplitude signal to the third input terminal of the power amplifying section in the compressed mode; a first switch for switching connection such that the amplitude signal is inputted to the regulator in the uncompressed mode, and the amplitude signal is inputted to the second regulator in the compressed mode; and a second switch for switching connection such that the DC voltage is supplied from the first DC power source to the third input terminal of the power amplifying section in the uncompressed mode, and the voltage based on the amplitude signal is supplied from the second regulator to the third input terminal of the power amplifying section in the compressed mode.

Preferably, the transmitter circuit switches the operation mode of the power amplifying section between the uncompressed mode and the compressed mode, according to a look-up table in which the power information and the operation modes are defined.

Further, the transmitter circuit may switch the operation mode of the power amplifying section to the uncompressed mode when the power information indicates a value less than a predetermined threshold value, and may switch the operation mode of the power amplifying section to the compressed mode when the power information indicates a value greater than or equal to the predetermined threshold value.

Further, the transmitter circuit may switch an operation mode of the power amplifying section to a first mode when power information indicates a small value, and switch the operation mode of the power amplifying section to a second mode when the power information indicates a great value. In this case, the regulator supplies the current based on the amplitude signal, to the second input terminal of the power amplifying section, in the first mode. Further, the transmitter circuit further includes: a first DC power source for supplying a DC voltage to the third input terminal of the power amplifying section in the first mode: a second DC power source for supplying a DC voltage to the second input terminal of the power amplifying section in the second mode; a second regulator for supplying a voltage based on the amplitude signal, to the third input terminal of the power amplifying section, in the second mode; a first switch for switching connection such that the amplitude signal is inputted to the regulator in the first mode, and the amplitude signal is inputted to the second regulator in the second mode; and a second switch for switching connection such that the DC voltage is supplied from the first DC power source to the third input terminal of the power amplifying section in the first mode, and the voltage based on the amplitude signal is supplied from the second regulator to the third input terminal of the power amplifying section in the second mode.

Preferably, the power amplifying section switches the operation mode between the first mode and the second mode, according to a look-up table in which the power information and the operation modes are defined.

Further, the power amplifying section may switch the operation mode to the first mode when the power information indicates a value less than a predetermined threshold value, and may switch the operation mode to the second mode when the power information indicates a value greater than or equal to the predetermined threshold value.

Preferably, the transmitter circuit further includes a distortion compensation section for predistorting at least one of the amplitude signal and the phase signal generated by the signal generation section, to compensate for at least one of an AM-PM distortion and an AM-AM distortion which occur in the amplifier circuit.

Further, the transmitter circuit may further include: a temperature measurement section for measuring temperature information of the power amplifying section; a look-up table in which the temperature information of the power amplifying section and coefficients corresponding to the temperature information are preset; a control section for reading a corresponding one of the coefficients from the look-up table, based on the temperature information measured by the temperature measurement section; and a multiplier for multiplying the amplitude signal by the corresponding one of the coefficients having been read by the control section.

Further, the transmitter circuit may further include: a temperature measurement section for measuring temperature information of the power amplifying section; a look-up table in which the temperature information of the power amplifying section and coefficients corresponding to the temperature information are preset; a control section for reading a corresponding one of the coefficients from the look-up table, based on the temperature information measured by the temperature measurement section; and an adder for adding, to the amplitude signal, the corresponding one of the coefficients having been read by the control section.

Alternatively, the transmitter circuit may further include: a temperature measurement section for measuring temperature information of the power amplifying section; a look-up table in which the temperature information of the power amplifying section, first coefficients corresponding to the temperature information, and second coefficients corresponding to the temperature information are preset; a control section for reading, from the look-up table, a corresponding one of the first coefficients and a corresponding one of the second coefficients, based on the temperature information measured by the temperature measurement section; a multiplier for multiplying the amplitude signal by the corresponding one of the first coefficients having been read by the control section; and an adder for adding, to the amplitude signal, the corresponding one of the second coefficients having been read by the control section.

Further, the present invention is also directed to a communication apparatus including the transmitter circuit described above. The communication apparatus includes a transmitter circuit for generating a transmission signal; and an antenna for outputting the transmission signal generated in the transmitter circuit. Further, the communication apparatus may further include a receiver circuit for processing a reception signal received via the antenna; and an antenna duplexer for outputting, to the antenna, the transmission signal generated in the transmitter circuit, and outputting, to the reception circuit, the reception signal received via the antenna.

Advantageous Effects of the Invention

As described above, in the transmitter circuit according to the present invention, a current based on the amplitude signal is supplied as a bias current to the power amplifying section. Further, also when output power is low, a DC voltage having such a magnitude as to enable the power amplifying section to linearly operate without causing variation is supplied as a collector voltage to the power amplifying section. Thus, also when output power of the power amplifying section is low, reduction of the collector voltage and increase of the modulation distortion can be prevented.

Further, the communication apparatus according to the present invention is able to not only ensure accuracy of an output signal in a wide bandwidth, but also operate with enhanced efficiency, by using the transmitter circuit described above.

BRIEF DESCRIPTION OF THE DRAWINGS

FIG. 1 is a block diagram illustrating an exemplary configuration of a transmitter circuit 1 according to a first embodiment of the present invention.

FIG. 2 illustrates an exemplary LUT in which relationship between power information P and operation modes of a power amplifying section 141 is stored.

FIG. 6 illustrates an example of a LUT 19 in which temperature information T of an amplifier circuit 24 and a coefficient α corresponding to the temperature information T are preset.

FIG. 9A illustrates an exemplary LUT in which the power information P and points to which switches are to be connected are stored.

FIG. 9B illustrates an exemplary LUT in which the power information P and operation modes are stored.

DESCRIPTION OF EMBODIMENTS

First Embodiment

Figure 3:
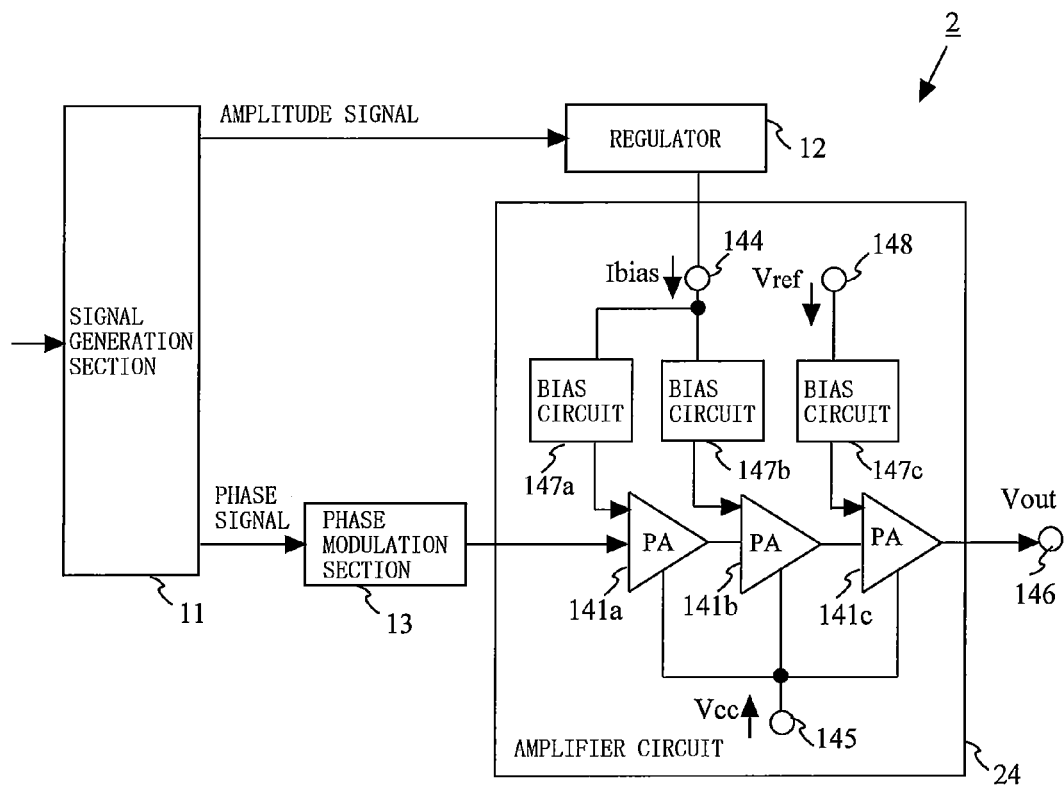
FIG. 3 is a block diagram illustrating an exemplary configuration of a transmitter circuit 2 according to a second embodiment of the present invention.

FIG. 1 is a block diagram illustrating an exemplary configuration of a transmitter circuit 1 according to a first embodiment of the present invention. In FIG. 1, the transmitter circuit 1 includes a signal generation section 11, a regulator 12, a phase modulation section 13, and an amplifier circuit 14. The amplifier circuit 14 includes a power amplifying section (PA) 141, a base bias terminal 144, a collector terminal 145, and a bias circuit 147. The signal generation section 11 subjects a baseband signal to a predetermined signal process, to generate an amplitude signal and a phase signal. The amplitude signal is inputted to the regulator 12. The regulator 12 supplies the amplifier circuit 14 with a current based on the amplitude signal. The regulator 12 typically supplies the amplifier circuit 14 with a current proportional to a magnitude of the amplitude signal.

On the other hand, the phase signal is inputted to the phase modulation section 13. The phase modulation section 13 phase-modulates the phase signal, to output a phase-modulated signal. The phase-modulated signal is inputted to the amplifier circuit 14. The amplifier circuit 14 amplifies the phase-modulated signal according to the current supplied from the regulator 12. A signal obtained by the amplification performed by the amplifier circuit 14 is outputted as a transmission signal through an output terminal 146.

Next, an operation performed by the amplifier circuit 14 will be described in detail. In the amplifier circuit 14, the power amplifying section 141 includes an amplifying transistor 142, an adder 143, and the like. In the description herein, the amplifying transistor 142 is a bipolar transistor. However, the amplifying transistor 142 may be a field-effect transistor (FET). In the amplifier circuit 14, the current based on the amplitude signal is supplied as a bias current Ibias to the base bias terminal 144 from the regulator 12.

Further, a DC voltage having a predetermined magnitude is supplied as a collector voltage Vcc to the collector terminal 145. The collector voltage Vcc to be supplied has such a magnitude as to enable the amplifying transistor 142 to linearly operate without causing variation. To the adder 143, the phase-modulated signal is inputted via the phase modulation section 13, and the bias current Ibias is inputted via the bias circuit 147. The adder 143 adds the bias current Ibias to the phase-modulated signal, to output a resultant signal to the amplifying transistor 142. The amplifying transistor 142 amplifies the phase-modulated signal inputted from the adder 143, to output a resultant signal as a transmission signal through the output terminal 146.

The power amplifying section 141 may switch an operation mode between a compressed mode and an uncompressed mode. As a switching method, a method in which a look-up table (LUT) is referred to, or a method using a determination based on a threshold value is used. For example, a control section (not shown) is able to switch an operation mode of the power amplifying section 141 based on a look-up table (see, for example, FIG. 2) in which relationship between power information P and operation modes of the power amplifying section 141 is stored. It is to be noted that, in FIG. 2, the power information P satisfies P1<P2<P3<P4 . . . .

Alternatively, the control section may compare the power information P with a threshold value for switching the operation mode, to switch the operation mode of the power amplifying section 141. For example, the control section may determine that the operation mode is to be switched to the compressed mode when the power information P indicates a value greater than or equal to the threshold value for switching the operation mode, whereas the control section may determine that the operation mode is to be switched to the uncompressed mode when the power information P indicates a value less than the threshold value for switching the operation mode. The power information P is information indicative of a magnitude of transmission power required for communication with a base station, and the power information P is generated in a baseband circuit. For example, in the W-CDMA system, a transmission power control for transmission to and from the base station is performed at every time slot.

The number of the threshold values that are to be compared with the power information P for switching the operation mode is not limited to one, and may be plural. For example, the control section may have two threshold values, that is, a first threshold value for determining that the uncompressed mode is to be switched to the compressed mode, and a second threshold value for determining that the compressed mode is to be switched to the uncompressed mode. In this case, the control section may determine that the operation mode is to be switched to the compressed mode when the power information P indicates a value greater than or equal to the first threshold value, whereas the control section may determine that the operation mode is to be switched to the uncompressed mode when the power information P indicates a value less than the second threshold value.

As described above, in the transmitter circuit 1 according to the first embodiment of the present invention, a current based on the amplitude signal is supplied as the bias current Ibias to the power amplifying section 141. Further, a DC voltage having such a magnitude as to enable the power amplifying section 141 to linearly operate without causing variation even in the case of an output power being low, is supplied as the collector voltage Vcc to the power amplifying section 141. Thus, even when an output power of the power amplifying section 141 is low, reduction of the collector voltage Vcc, and increase of modulation distortion can be prevented.

Second Embodiment

FIG. 3 is a block diagram illustrating an exemplary configuration of a transmitter circuit 2 according to a second embodiment of the present invention. In FIG. 3, the transmitter circuit 2 is different from the transmitter circuit of the first embodiment in that, in the transmitter circuit 2, the amplifier circuit 24 includes a plurality of power amplifying sections (PAs). The amplifier circuit 24 includes: a first, a second, and a third power amplifying sections 141a, 141b, and 141c which are connected in cascade: a first, a second, and a third bias circuits 147a, 147b, and 147c: base bias terminals 144 and 148; and a collector terminal 145.

In the amplifier circuit 24, a current based on the amplitude signal is supplied as a bias current Ibias to the base bias terminal 144 from the regulator 12. A DC voltage is supplied as a bias voltage Vref to the base bias terminal 148. The bias current Ibias is supplied to the first power amplifying section 141a via the first bias circuit 147a. The bias current Ibias is supplied to the second power amplifying section 141b via the second bias circuit 147b. The bias voltage Vref is supplied to the third power amplifying section 141c via the third bias circuit 147c.

A collector voltage Vcc is supplied to the first, the second, and the third power amplifying sections 141a, 141b, and 141c via the collector terminal 145. The collector voltage Vcc to be supplied has such a magnitude as to enable the first, the second, and the third power amplifying sections 141a, 141b, and 141c to linearly operate without causing variation.

The number of the power amplifying sections and the number of the bias circuits are each three in the configuration of the amplifier circuit 24 described above. However, each of the number of the power amplifying sections and the number of the bias circuits may be any plural number. Further, a configuration is described above in which the bias current Ibias is supplied to the first power amplifying section 141a and the second power amplifying section 141b, and the bias voltage Vref is supplied to the third power amplifying section 141c. However, when the bias current Ibias is supplied to at least one of the first, the second, and the third power amplifying sections 141a, 141b, and 141c, the input may be performed with any combination thereof.

As described above, also in the transmitter circuit 2 according to the second embodiment of the present invention in which the amplifier circuit 24 includes the power amplifying sections 141a, 141b, and 141c which are connected in cascade, the same effect as obtained in the first embodiment can be obtained.

Third Embodiment

Figure 4:
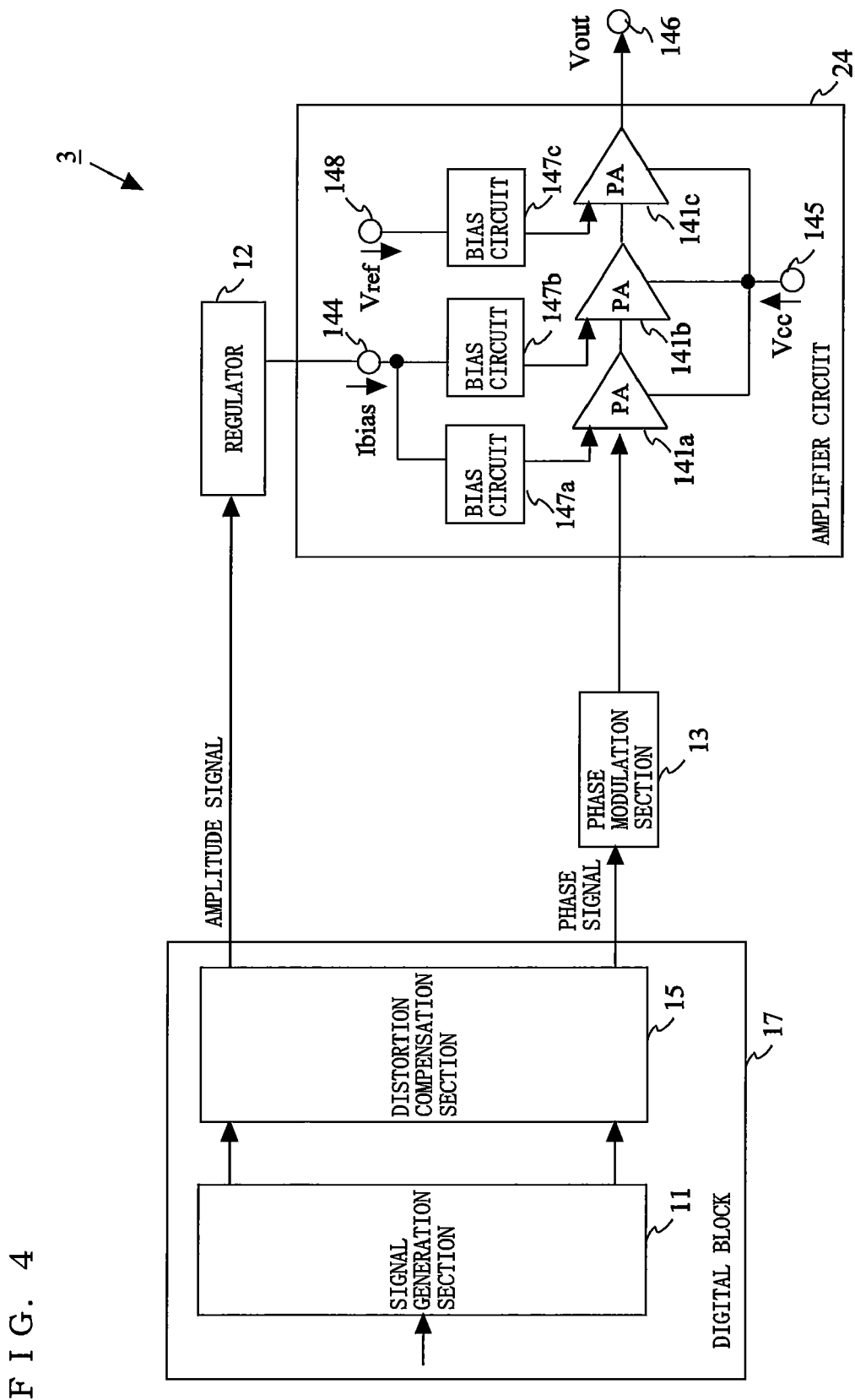
FIG. 4 is a block diagram illustrating an exemplary configuration of a transmitter circuit 3 according to a third embodiment of the present invention.

FIG. 4 is a block diagram illustrating an exemplary configuration of a transmitter circuit 3 according to a third embodiment of the present invention. In FIG. 4, the transmitter circuit 3 is different from the transmitter circuits 1 and 2 according to the first and the second embodiments in that the transmitter circuit 3 further includes a distortion compensation section 15. The distortion compensation section 15 predistorts at least one of the amplitude signal and the phase signal that are generated in the signal generation section 11, to compensate for at least one of an AM-PM distortion and an AM-AM distortion which occur in the amplifier circuit 24. A configuration including the signal generation section 11 and the distortion compensation section 15 may be referred to as a digital block 17. Further, although the transmitter circuit 3 shown in FIG. 4 has a configuration in which the amplifier circuit 24 according to the second embodiment is used, the transmitter circuit 3 may have a configuration in which the amplifier circuit 14 according to the first embodiment is used.

As described above, in the transmitter circuit 3 according to the third embodiment of the present invention, the same effect as obtained in the first and the second embodiments can be obtained, and at least one of an AM-PM distortion and an AM-AM distortion that occur in the amplifier circuit 24 can be compensated for.

Fourth Embodiment

Figure 5:
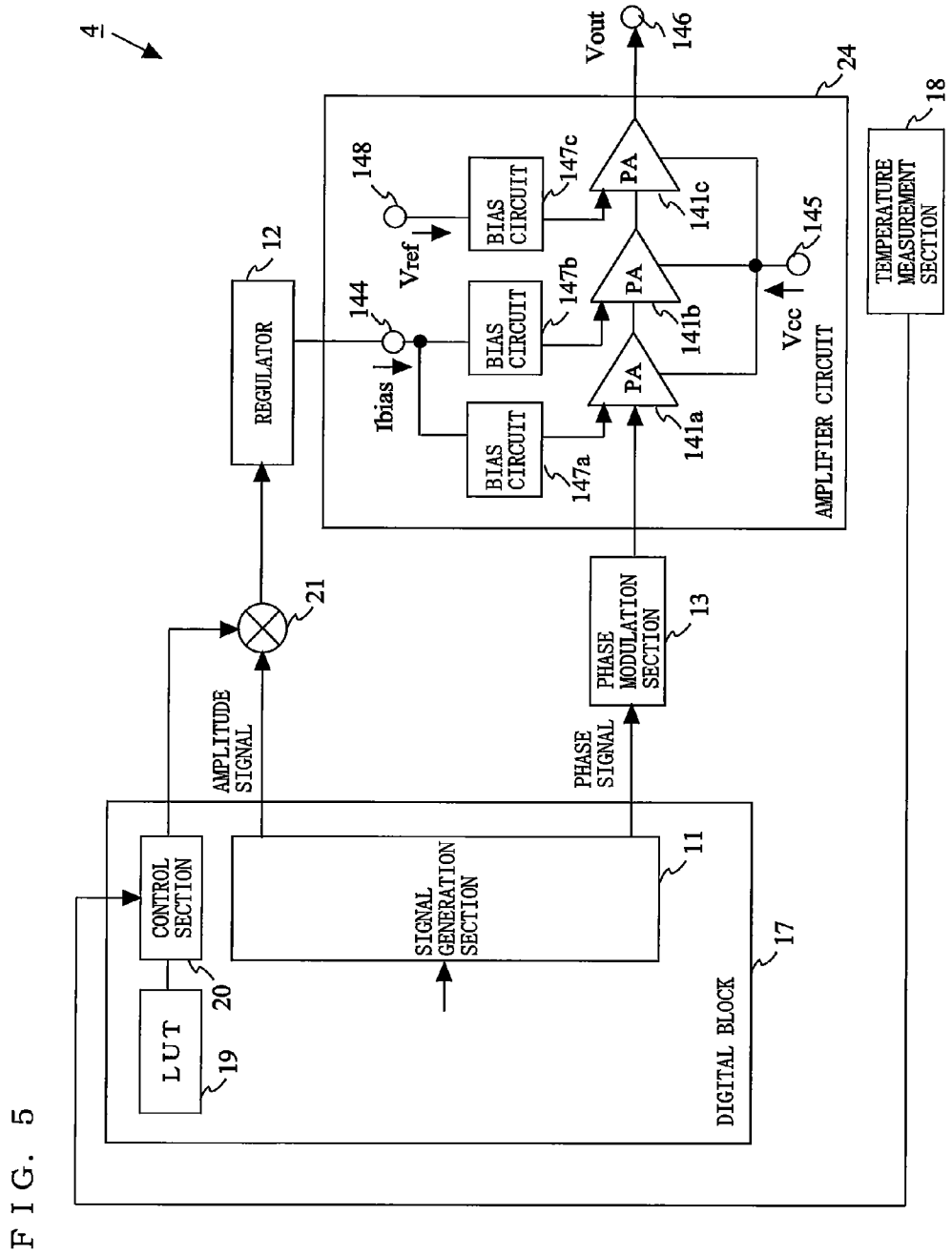
FIG. 5 is a block diagram illustrating an exemplary configuration of a transmitter circuit 4 according to a fourth embodiment of the present invention.

FIG. 5 is a block diagram illustrating an exemplary configuration of a transmitter circuit 4 according to a fourth embodiment of the present invention. In FIG. 5, the transmitter circuit 4 is different from the transmitter circuits 1 to 3 according to the first to the third embodiments in that the transmitter circuit 4 further includes a block for performing temperature compensation, for the power amplifying sections 141a, 141b, and 141c. Specifically, the transmitter circuit 4 further includes a temperature measurement section 18, a look-up table (LUT) 19, a control section 20, and a multiplier 21. The temperature measurement section 18 measures temperature of the power amplifying sections 141a, 141b, and 141c, to output the temperature as temperature information T to the control section 20. The temperature measurement section 18 and the power amplifying sections 141a, 141b, and 141c may be provided on the same substrate so as to accurately detect temperature change in the power amplifying sections 141a, 141b, and 141c. Further, the temperature measurement section 18 may measure temperature of the amplifier circuit 24.

In the LUT 19, the temperature information T of the power amplifying sections 141a, 141b, and 141c (or the amplifier circuit 24), and a coefficient α corresponding to the temperature information T are preset (see, for example, FIG. 6). The control section 20 obtains the coefficient α corresponding to the temperature information T with reference to the LUT 19, and sets the coefficient α in the multiplier 21. The multiplier 21 multiplies the amplitude signal by the coefficient α. Thus, the transmitter circuit 4 is able to compensate for a distortion caused due to temperature change in the power amplifying sections 141a, 141b, and 141c (or in the amplifier circuit 24).

A configuration including the signal generation section 11, the LUT 19, and the control section 20 may be referred to as a digital block 17.

Figure 7A:
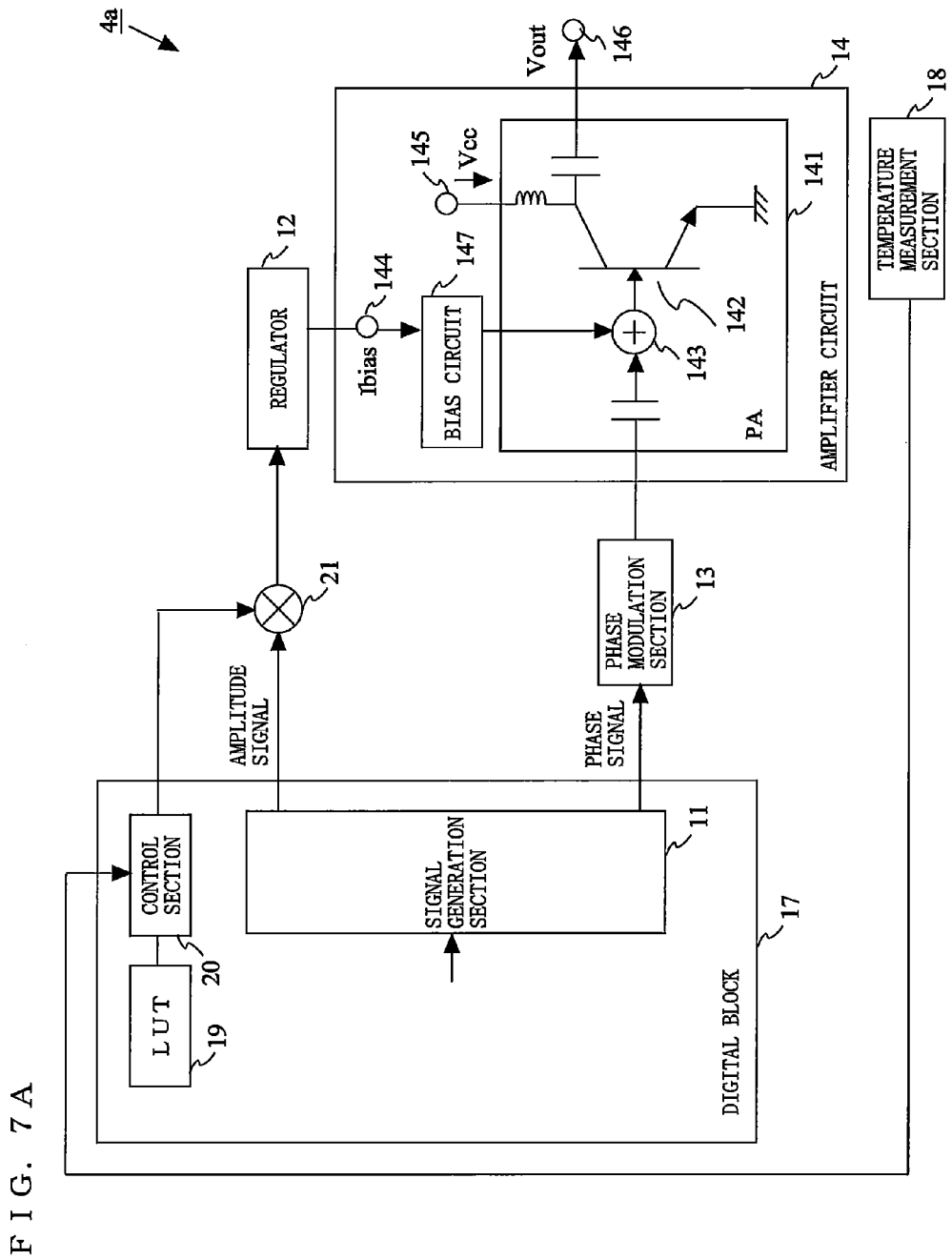
FIG. 7A is a block diagram illustrating an exemplary configuration of a transmitter circuit 4a according to the fourth embodiment of the present invention.

Further, although a configuration in which the transmitter circuit 2 according to the second embodiment includes the block for performing the temperature compensation is used for the transmitter circuit 4 shown in FIG. 5, a configuration in which either the transmitter circuit 1 according to the first embodiment or the transmitter circuit 3 according to the third embodiment includes the block for performing the temperature compensation may be used for the transmitter circuit 4. Namely, a configuration in which the transmitter circuit 1 according to the first embodiment includes the block for performing the temperature compensation, is shown as a transmitter circuit 4a in FIG. 7A. FIG. 7A is a block diagram illustrating an exemplary configuration of the transmitter circuit 4a according to the fourth embodiment of the present invention. In FIG. 7A, the transmitter circuit 4a is different from the transmitter circuit 4 shown in FIG. 5 in that the transmitter circuit 4a includes the amplifier circuit 14 according to the first embodiment, instead of the amplifier circuit 24 according to the second embodiment. Also in this case, the temperature measurement section 18 measures temperature of the power amplifying section 141 (or the amplifier circuit 14).

Figure 7B:
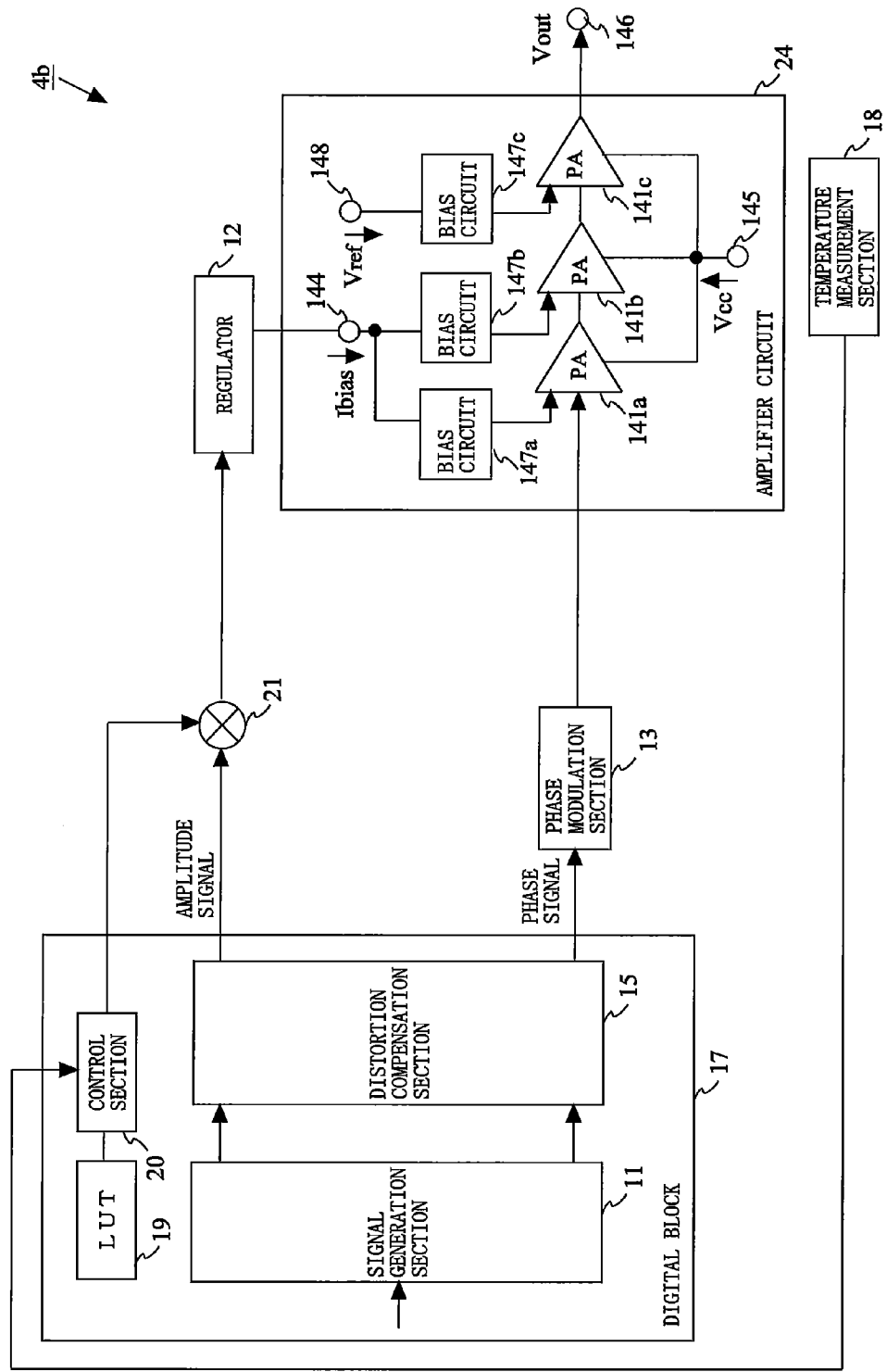
FIG. 7B is a block diagram illustrating an exemplary configuration of a transmitter circuit 4b according to the fourth embodiment of the present invention.

Further, a configuration in which the transmitter circuit 3 according to the third embodiment includes the temperature compensating block, is shown as a transmitter circuit 4b in FIG. 7B. FIG. 7B is a block diagram illustrating an exemplary configuration of the transmitter circuit 4b according to the fourth embodiment of the present invention. In FIG. 7B, the transmitter circuit 4b is different from the transmitter circuit 4 shown in FIG. 5 in that the transmitter circuit 4b further includes the distortion compensation section 15. A configuration of the transmitter circuit 4b, which includes the signal generation section 11, the distortion compensation section 15, the LUT 19, and the control section 20, may be referred to as a digital block 17.

Figure 7C:
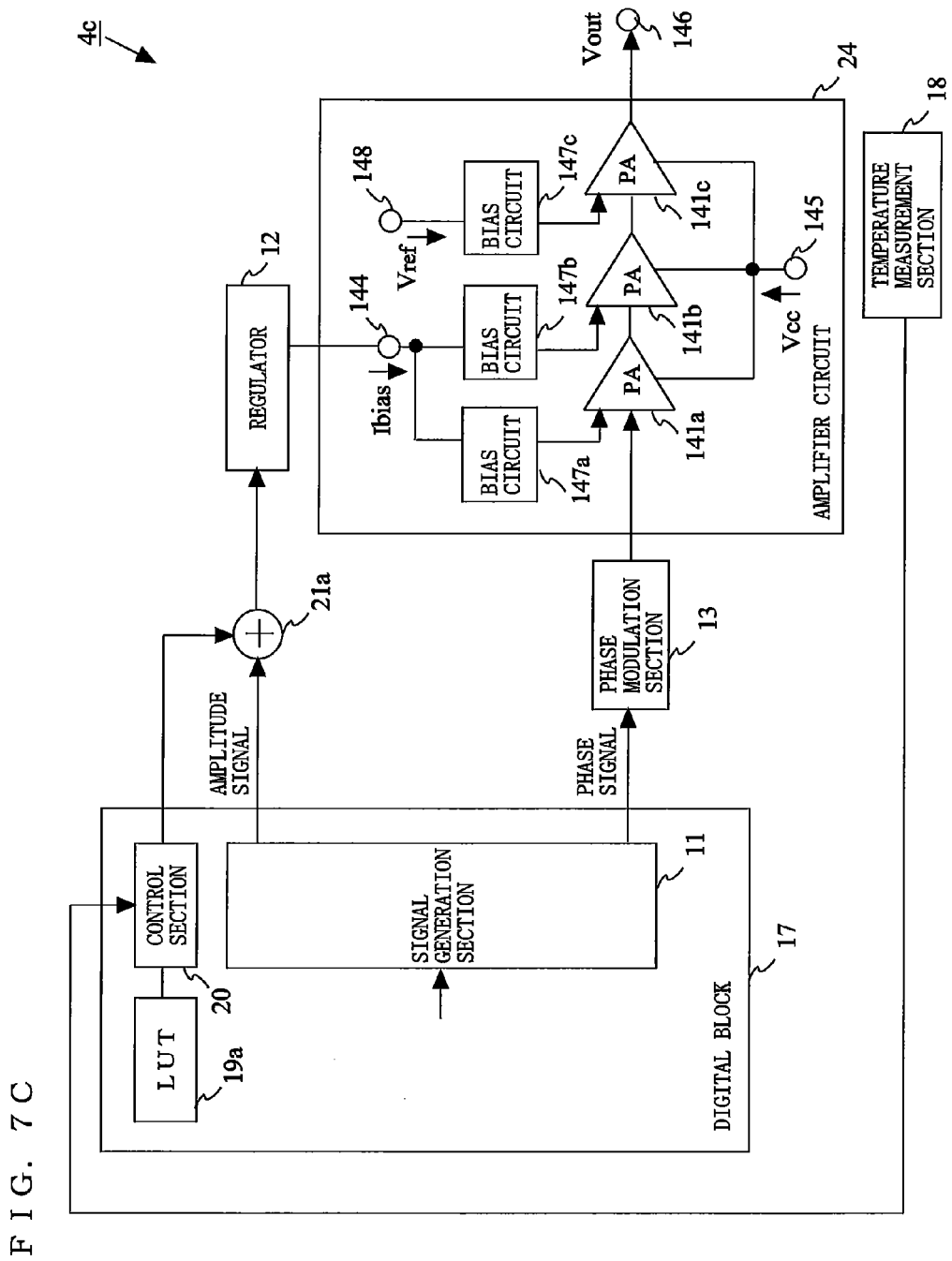
FIG. 7C is a block diagram illustrating an exemplary configuration of a transmitter circuit 4c according to the fourth embodiment of the present invention.

Further, any one of the transmitter circuits shown in FIG. 5, FIG. 7A, and FIG. 7B each including an adder 21a instead of the multiplier 21 may be used as a transmitter circuit 4c shown in FIG. 7C for the transmitter circuit according to the fourth embodiment. FIG. 7C is a block diagram illustrating an exemplary configuration of the transmitter circuit 4c according to the fourth embodiment of the present invention. In FIG. 7C, in a LUT 19a, the temperature information T of the power amplifying sections 141a, 141b, and 141c (or the amplifier circuit 24), and a coefficient $\alpha'$ corresponding to the temperature information T are preset. The control section 20 obtains the coefficient $\alpha'$ corresponding to the temperature information T with reference to the LUT 19a, and sets the coefficient $\alpha'$ in the adder 21a. The adder 21a adds the coefficient $\alpha'$ to the amplitude signal.

Figure 7D:
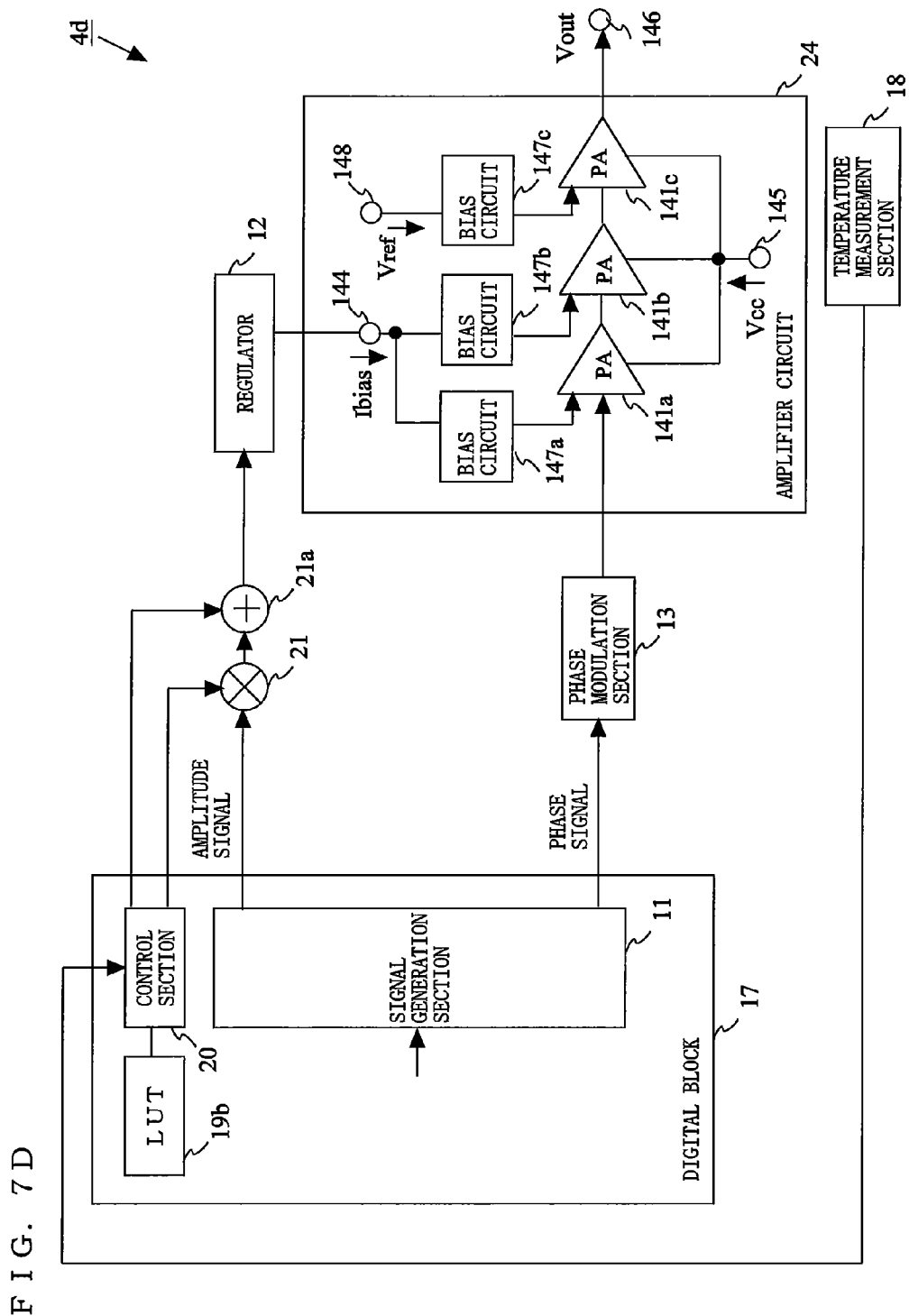
FIG. 7D is a block diagram illustrating an exemplary configuration of a transmitter circuit 4d according to the fourth embodiment of the present invention.

Further, any one of the transmitter circuits shown in FIG. 5, FIG. 7A, and FIG. 7B each including both the multiplier 21 and the adder 21a, may be used as a transmitter circuit 4d shown in FIG. 7D for the transmitter circuit according to the fourth embodiment. FIG. 7D is a block diagram illustrating an exemplary configuration of the transmitter circuit 4d according to the fourth embodiment of the present invention. In FIG. 7D, in a LUT 19b, the temperature information T of the power amplifying sections 141a, 141b, and 141c (or the amplifier circuit 24) and the coefficients $\alpha$ and $\alpha'$ corresponding to the temperature information T are preset. The control section 20 obtains the coefficients $\alpha$ and $\alpha'$ corresponding to the temperature information T, with reference to the LUT 19b, sets the coefficient $\alpha$ in the multiplier 21, and sets the coefficient $\alpha'$ in the adder 21a. The multiplier 21 multiplies the amplitude signal by the coefficient $\alpha$. The adder 21a adds the coefficient $\alpha'$ to the amplitude signal. The adder 21a is connected following the multiplier 21 in FIG. 7D. However, also when the multiplier 21 and the adder 21a are connected in the reverse order, the same effect can be obtained.

As described above, in the transmitter circuit 4 according to the fourth embodiment of the present invention, the same effects as obtained in the first to the third embodiments can be obtained, and distortion caused by temperature change in the power amplifying section 141 (or the amplifier circuit 14) or the power amplifying sections 141a, 141b, and 141c (or the amplifier circuit 24) can be compensated for.

Fifth Embodiment

Figure 8:
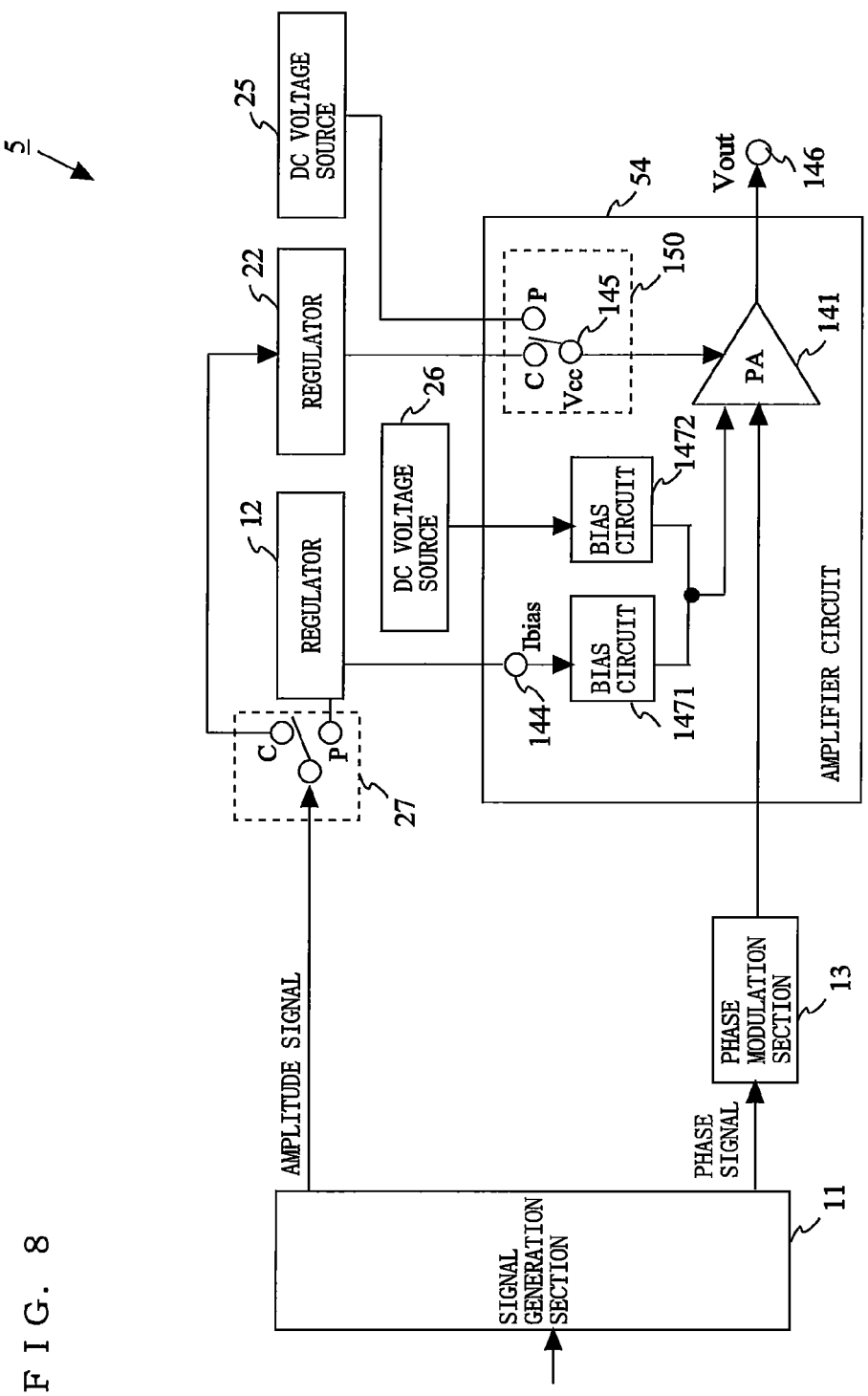
FIG. 8 is a block diagram illustrating an exemplary configuration of a transmitter circuit 5 according to a fifth embodiment of the present invention.

FIG. 8 is a block diagram illustrating an exemplary configuration of a transmitter circuit 5 according to a fifth embodiment of the present invention. In FIG. 8, the transmitter circuit 5 is different from the transmitter circuits 1 to 4 according to the first to fourth embodiments in that a second regulator 22, a first DC power source 25, a second DC power source 26, and a first switch 27 are additionally provided in the transmitter circuit 5. Further, an amplifier circuit 54 is different in configuration from the amplifier circuits 14 and 24 described above. The amplifier circuit 54 includes: a power amplifying section 141; a base bias terminal 144; a first bias circuit 1471 and a second bias circuit 1472; and a second switch 150. The second switch 150 includes a collector terminal 145. Further, in the present embodiment, for convenience sake, the regulator 12 is referred to as a first regulator 12.

A control section (not shown) switches connections of the first switch 27 and the second switch 150. As the switching manner, multiple manners can be provided. One manner is a manner in which the first switch 27 and the second switch 150 are switched in conjunction with switching between the compressed mode and the uncompressed mode. Specifically, when the control section determines that the operation mode is to be switched to the compressed mode in the method as described in the first embodiment, the control section switches the connection of the first switch 27 so as to input an amplitude signal to the second regulator 22 (namely, switches the first switch 27 so as to be connected to a terminal C side). Further, the control section switches the connection of the second switch 150 so as to input an output signal of the second regulator 22 to the collector terminal 145 for the power amplifying section 141 (namely, switches the second switch 150 so as to be connected to the terminal C side).

On the other hand, when the control section determines that the operation mode is to be switched to the uncompressed mode in the method as described in the first embodiment, the control section switches the connection of the first switch 27 so as to input an amplitude signal to the first regulator 12 (namely, switches the first switch 27 so as to be connected to a terminal P side). Further, the control section switches the connection of the second switch 150 so as to supply the collector terminal 145 for the power amplifying section 141 with a DC voltage generated in the first DC voltage source 25 (namely, switches the second switch 150 so as to be connected to the terminal P side).

The first switch 27 and the second switch 150 may not necessarily be switched in conjunction with the switching between the compressed mode and the uncompressed mode. For example, the control section may use a method based on a look-up table (LUT) that is different from that described in the first embodiment, or make determination by using a threshold value that is different from that for switching the operation mode. For example, the control section may switch connections of the first switch 27 and the second switch 150, based on a look-up table (see, for example, FIG. 9A) in which the power information P and points to which the switches are to be connected are stored. It is to be noted that the power information P satisfies P1<P2<P3<P4 . . . in FIG. 9A.

Further, the control section may switch connections of the first switch 27 and the second switch 150, based on a look-up table (see, for example, FIG. 9B) in which the power information P, and the operation modes (a first mode and a second mode)) of the power amplifying section 141 are stored. It is to be noted that the power information P satisfies P1<P2<P3<P4 . . . in FIG. 9B. In the first mode, a current based on the amplitude signal is supplied to the base bias terminal 144 from the first regulator 12, and a DC voltage is supplied to the collector terminal 145 from the first DC power source 25. On the other hand, in the second mode, a DC voltage is supplied to the base bias terminal 144 from the second DC power source 26, and a voltage based on the amplitude signal is supplied to the collector terminal 145 from the second regulator 22.

When the control section determines that switching to the first mode is to be performed, the control section switches connections of the first switch 27 and the second switch 150 in a manner similar to the manner for the case of the switching to the uncompressed mode as described above being determined to be performed. On the other hand, when the control section determines that switching to the second mode is to be performed, the control section switches connections of the first switch 27 and the second switch 150 in a manner similar to the manner for the case of the switching to the compressed mode as described above being determined to be performed.

Alternatively, the control section may switch connections of the first switch 27 and the second switch 150 by comparing the power information P with a threshold value for switching of the switches. For example, the control section switches connection of the first switch 27 so as to input an amplitude signal to the second regulator 22 (namely, switches the first switch 27 so as to be connected to the terminal C side) when the power information P indicates a value greater than or equal to the threshold value for switching of the switches. Further, the control section switches connection of the second switch 150 so as to input an output signal of the second regulator 22 to the collector terminal 145 for the power amplifying section 141 (namely, switches the second switch 150 so as to be connected to the terminal C side).

On the other hand, the control section switches connection of the first switch 27 so as to input an amplitude signal to the first regulator 12 (namely, switches the first switch 27 so as to be connected to the terminal P side) when the power information P indicates a value less than the threshold value for switching of the switches. Further, the control section switches connection of the second switch 150 so as to supply the collector terminal 145 for the power amplifying section 141 with a DC voltage generated in the first DC voltage source 25 (namely, switches the second switch 150 so as to be connected to the terminal P side).

The first regulator 12 supplies the base bias terminal 144 with a current based on the amplitude signal when the first switch 27 and the second switch 150 are each connected to the terminal P side. The first DC voltage source 25 supplies a DC voltage having a predetermined magnitude, as a collector voltage Vcc, to the collector terminal 145 when the first switch 27 and the second switch 150 are each connected to the terminal P side. The collector voltage Vcc to be supplied has such a magnitude as to enable the power amplifying section 141 to linearly operate without causing variation.

The second regulator 22 supplies the collector terminal 145 with a voltage based on the amplitude signal when the first switch 27 and the second switch 150 are each connected to the terminal C. The second regulator 22 may supply the collector terminal 145 with a current based on the amplitude signal. The second DC voltage source 26 supplies a DC voltage having a predetermined magnitude, as a bias voltage, to the power amplifying section 141 via the second bias circuit 1472 when the first switch 27 and the second switch 150 are each connected to the terminal C side.

Figure 10:
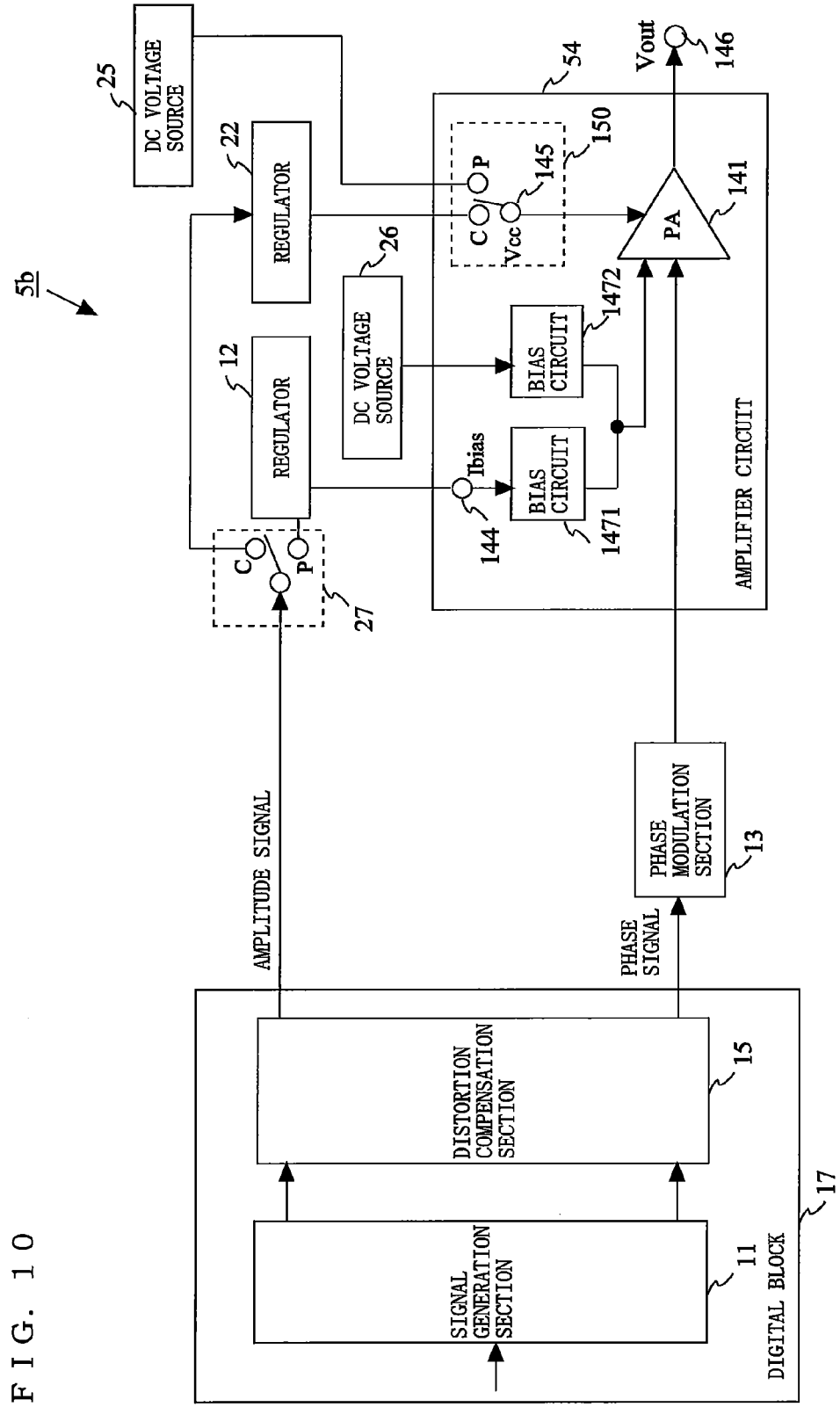
FIG. 10 is a block diagram illustrating an exemplary configuration of a transmitter circuit 5b according to the fifth embodiment of the present invention.

Further, in the transmitter circuit 5 according to the fifth embodiment, the amplifier circuit 54 may be configured so as to include the power amplifying sections 141 that are connected in cascade similarly to the amplifier circuit 24 according to the second embodiment. Further, the transmitter circuit 5 may be configured so as to further include the distortion compensation section 15 similarly to the transmitter circuit according to the third embodiment (see, for example, FIG. 10). In a transmitter circuit 5b shown in FIG. 10, the operation of the distortion compensation section 15 is the same as described in the third embodiment.

Figure 11:
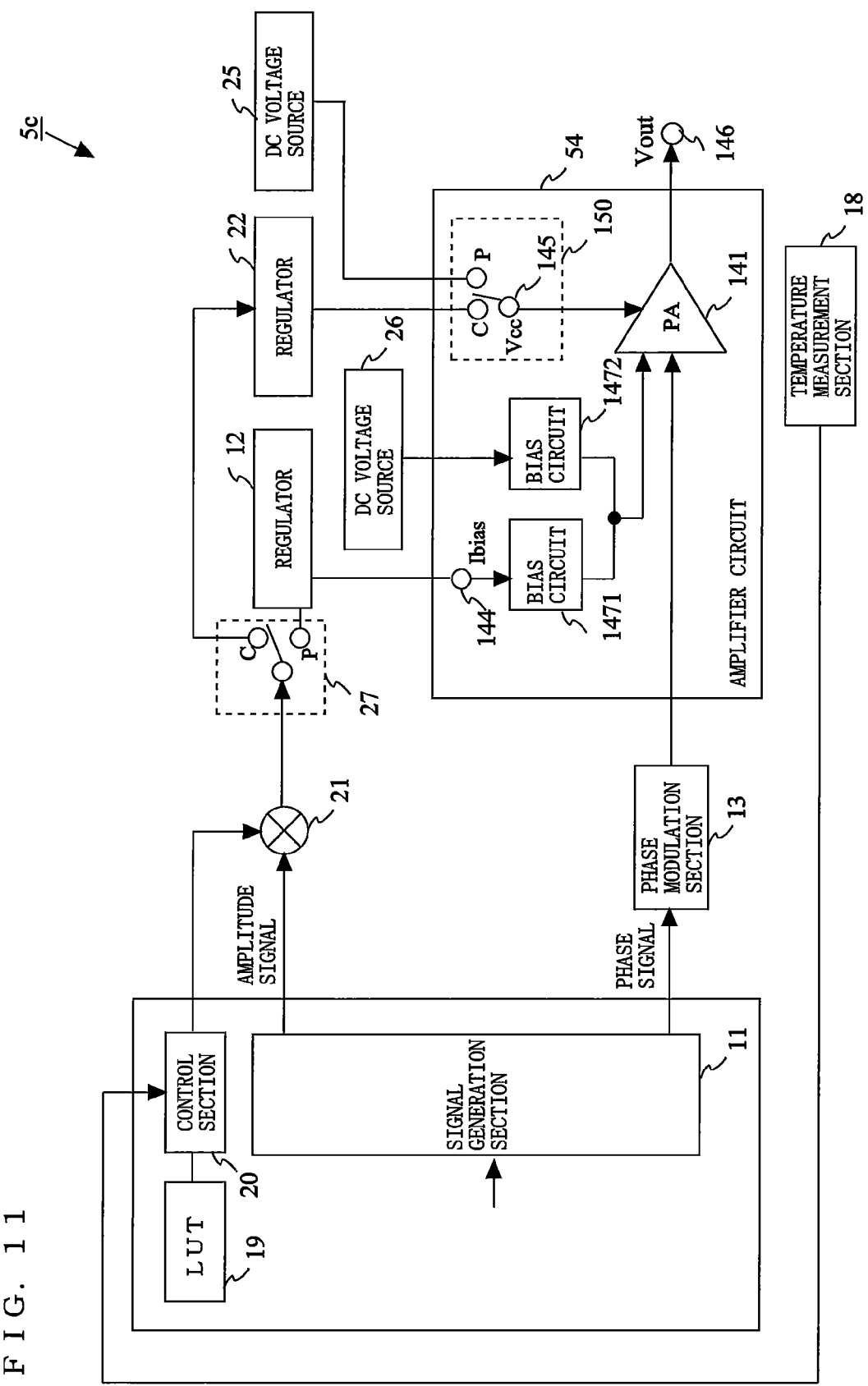
FIG. 11 is a block diagram illustrating an exemplary configuration of a transmitter circuit 5c according to the fifth embodiment of the present invention.

Further, the transmitter circuit 5 may further include a block (namely, the temperature measurement section 18, the LUT 19, the control section 20, and the multiplier 21) for performing temperature compensation, for the amplifier circuit 54, similarly to the transmitter circuit according to the fourth embodiment (see FIG. 11). In a transmitter circuit 5c shown in FIG. 11, operations of the temperature measurement section 18, the LUT 19, the control section 20, and the multiplier 21 are the same as described in the fourth embodiment. Further, the transmitter circuit 5c may be configured so as to include an adder 21a instead of the multiplier 21, or may be configured so as to include both the multiplier 21 and the adder 21a.

Figure 12:
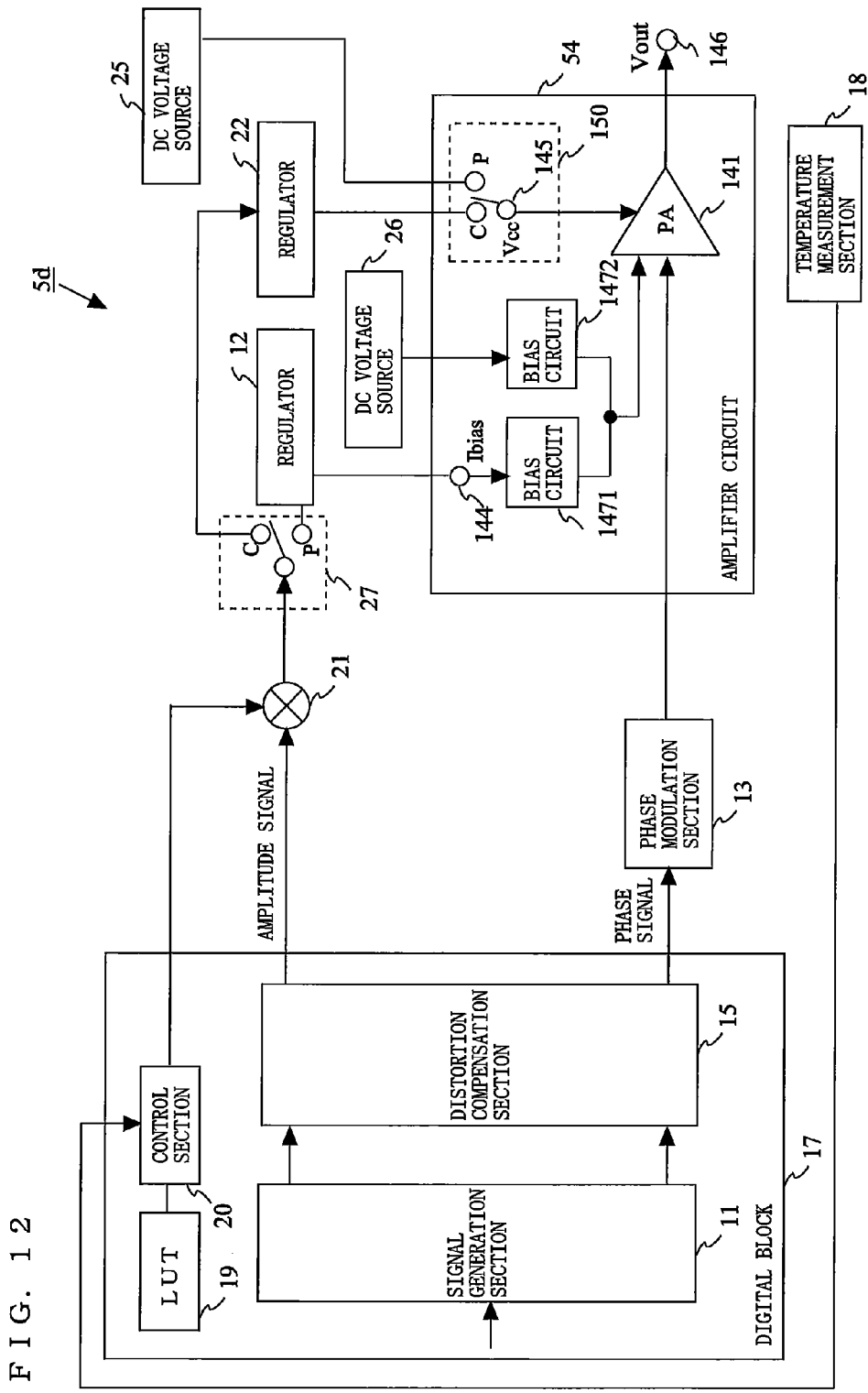
FIG. 12 is a block diagram illustrating an exemplary configuration of a transmitter circuit 5d according to the fifth embodiment of the present invention.

Furthermore, the transmitter circuit 5 may be configured so as to include both the distortion compensation section 15 and the block for performing temperature compensation, for the amplifier circuit 54 (see FIG. 12). In a transmitter circuit 5d shown in FIG. 12, the distortion compensation section 15 is the same one as described in the third embodiment, and operations of the temperature measurement section 18, the look-up table (LUT) 19, the control section 20, and the multiplier 21 are the same as described in the fourth embodiment. Further, the transmitter circuit 5d may be configured so as to include the adder 21a instead of the multiplier 21, or may be configured so as to include both the multiplier 21 and the adder 21a.

As described above, in the transmitter circuit 5 according to the fifth embodiment of the present invention, when an output power of the power amplifying section 141 is low, the first switch 27 and the second switch 150 are switched so as to be connected to the terminal P side, whereas when an output power of the power amplifying section 141 is high, the first switch 27 and the second switch 150 are switched so as to be connected to the terminal C side. Thus, when the output power of the power amplifying section 141 is low, the same effects as described in the first to the fourth embodiments can be obtained, and when the output power of the power amplifying section 141 is high, the power amplifying section 141 subjects the phase-modulated signal to amplitude modulation according to a voltage supplied from the second regulator 22, to output a resultant signal as a modulated signal having been obtained by phase modulation and amplitude modulation.

Sixth Embodiment

Figure 13:
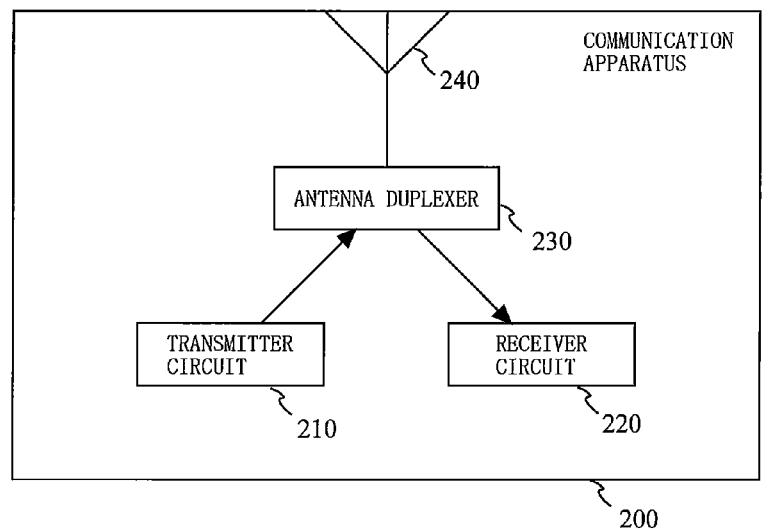
FIG. 13 is a block diagram illustrating an exemplary configuration of a communication apparatus according to a sixth embodiment of the present invention.
Figure 14:
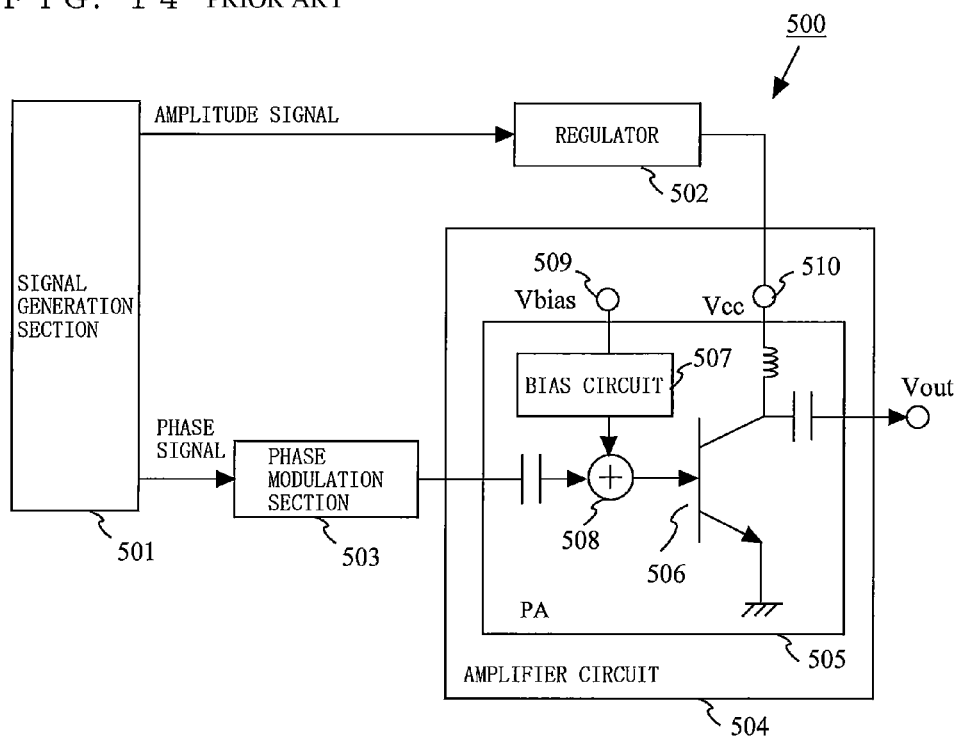
FIG. 14 is a block diagram illustrating a configuration of a conventional transmitter circuit 500.
Figure 15:
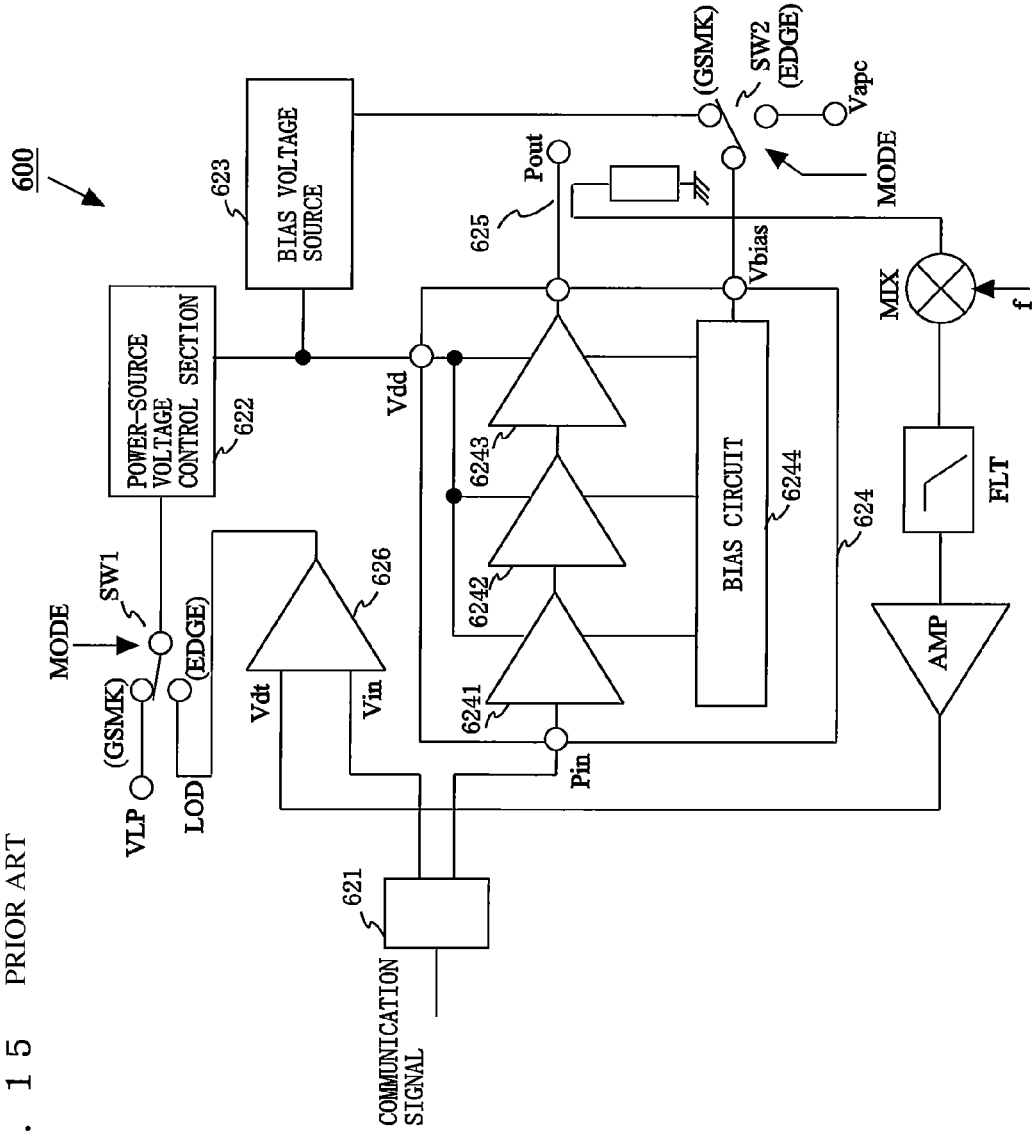
FIG. 15 is a block diagram illustrating a configuration of a conventional transmitter circuit 600.
Figure 16:
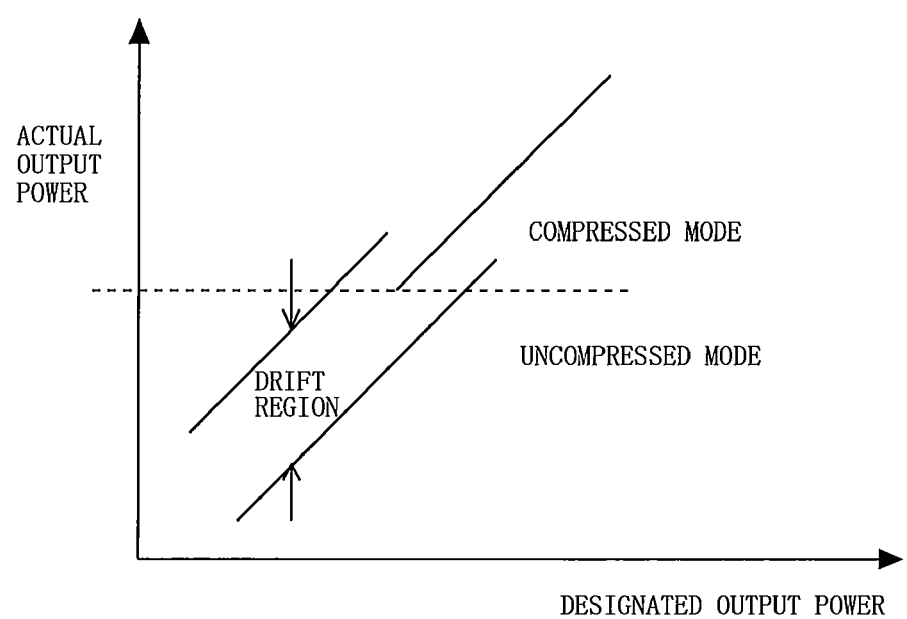
FIG. 16 illustrates an exemplary output power characteristic of the transmitter circuit 500 observed when switching between a compressed mode and an uncompressed mode is performed.

FIG. 13 is a block diagram illustrating an exemplary configuration of a communication apparatus according to a sixth embodiment of the present invention. In FIG. 13, a communication apparatus 200 according to the sixth embodiment includes a transmitter circuit 210, a receiver circuit 220, an antenna duplexer 230, and an antenna 240. The transmitter circuit 210 is implemented as any one of the transmitter circuits according to the first to the fifth embodiments as described above. The antenna duplexer 230 transfers, to the antenna 240, a transmission signal outputted from the transmitter circuit 210, thereby preventing the transmission signal from leaking into the receiver circuit 220. Further, the antenna duplexer 230 transfers, to the receiver circuit 220, a reception signal inputted from the antenna 240, thereby preventing the reception signal from leaking into the transmitter circuit 210.

Therefore, the transmission signal is outputted from the transmitter circuit 210, and is emitted into space from the antenna 240 via the antenna duplexer 230. The reception signal is received by the antenna 240, and is received by the receiver circuit 220 via the antenna duplexer 230. When any one of the transmitter circuits according to the first to the fifth embodiments is used for the communication apparatus 200 according to the sixth embodiment, linearity of the transmission signal can be ensured, and a wireless device capable of reducing distortion can be realized. Further, since an output from the transmitter circuit 210 does not diverge due to a directional coupler, loss generated from the transmitter circuit 210 to the antenna 240 can be reduced, so that power consumption for transmission can be reduced, and a wireless communication apparatus which enables a long time use can be implemented. The communication apparatus 200 may be configured so as to simply include the transmitter circuit 210 and the antenna 240.

INDUSTRIAL APPLICABILITY

The transmitter circuit according to the present invention is applicable to, for example, communication apparatuses such as mobile telephones and wireless LANs.

DESCRIPTION OF THE REFERENCE CHARACTERS 1 to 5, 4a, 4b, 5b, 5c, 5d transmitter circuit
11 signal generation section
12, 22 regulator
13 phase modulation section
14, 24, 54 amplifier circuit
15 distortion compensation section
17 digital block
18 temperature measurement section
19, 19a, 19b look-up table (LUT)
20 control section
21 multiplier
21a adder
25, 26 DC voltage source
27, 150 switch
141 power amplifying section
142 amplifying transistor
143 adder
144, 148 base bias terminal
145 collector terminal
146 output terminal
147, 1471, 1472 bias circuit
200 communication apparatus
210 transmitter circuit
220 receiver circuit
230 antenna duplexer
240 antenna
500, 600 transmitter circuit
501 signal generation section
502 regulator
503 phase modulation section
504 amplifier circuit
505 power amplifying section
506 amplifying transistor
507 bias circuit
508 adder
509 base bias terminal
510 collector terminal
621 amplitude-phase separation section
622 power-source voltage control section
623 bias voltage source
624 power amplifying section
625 coupler
626 comparator
6241 to 6243 power-amplifying FET
6244 bias circuit

The invention claimed is:

1. A transmitter circuit for outputting a transmission signal, the transmitter circuit comprising:
a signal generation section for generating an amplitude signal and a phase signal;
a regulator for outputting a current based on the amplitude signal;
a phase modulation section for phase-modulating the phase signal, and outputting a phase-modulated constant-envelope signal; and
an amplifier circuit for receiving the current that is based on the amplitude signal and supplied from the regulator, and amplifying the phase-modulated signal by using the supplied current, wherein
the amplifier circuit includes a power amplifying section for amplifying the phase-modulated signal,
the power amplifying section includes: a first input terminal to which the phase-modulated signal is inputted; a second input terminal to which a bias current is supplied; and a third input terminal to which a predetermined DC voltage is supplied,
the current based on the amplitude signal is supplied as the bias current to the second input terminal from the regulator when the power amplifying section amplifies the phase-modulated signal, and
the power amplifying section performs an amplitude modulation by varying an output depending on the bias current.

2. The transmitter circuit according to claim 1, wherein
the amplifier circuit includes a plurality of the power amplifying sections which are connected in cascade,
the current based on the amplitude signal is supplied as the bias current from the regulator to the second input terminal of at least one of the plurality of the power amplifying sections when the phase-modulated signal is amplified, and
the predetermined DC voltage is supplied to the third input terminal of each of the plurality of the power amplifying sections when the phase-modulated signal is amplified.

3. The transmitter circuit according to claim 1, wherein
the transmitter circuit switches an operation mode of the power amplifying section between an uncompressed mode and a compressed mode, according to power information,
the regulator supplies the current based on the amplitude signal to the second input terminal of the power amplifying section in the uncompressed mode, and the transmitter circuit further comprises:
  a first DC power source for supplying a DC voltage to the third input terminal of the power amplifying section in the uncompressed mode;
  a second DC power source for supplying a DC voltage to the second input terminal of the power amplifying section in the compressed mode;
  a second regulator for supplying a voltage based on the amplitude signal to the third input terminal of the power amplifying section in the compressed mode;
  a first switch for switching connection such that the amplitude signal is inputted to the regulator in the uncompressed mode, and the amplitude signal is inputted to the second regulator in the compressed mode; and
  a second switch for switching connection such that the DC voltage is supplied from the first DC power source to the third input terminal of the power amplifying section in the uncompressed mode, and the voltage based on the amplitude signal is supplied from the second regulator to the third input terminal of the power amplifying section in the compressed mode.

4. The transmitter circuit according to claim 3, wherein the transmitter circuit switches the operation mode of the power amplifying section between the uncompressed mode and the compressed mode, according to a look-up table in which the power information and the operation modes are defined.

5. The transmitter circuit according to claim 3, wherein the transmitter circuit switches the operation mode of the power amplifying section to the uncompressed mode when the power information indicates a value less than a predetermined threshold value, and switches the operation mode of the power amplifying section to the compressed mode when the power information indicates a value greater than or equal to the predetermined threshold value.

6. The transmitter circuit according to claim 1, wherein
  the transmitter circuit switches an operation mode of the power amplifying section to a first mode when power information indicates a small value, and switches the operation mode of the power amplifying section to a second mode when the power information indicates a great value,
  the regulator supplies the current based on the amplitude signal, to the second input terminal of the power amplifying section, in the first mode,
  the transmitter circuit further comprises:
    a first DC power source for supplying a DC voltage to the third input terminal of the power amplifying section in the first mode;
    a second DC power source for supplying a DC voltage to the second input terminal of the power amplifying section in the second mode;
    a second regulator for supplying a voltage based on the amplitude signal, to the third input terminal of the power amplifying section, in the second mode;
    a first switch for switching connection such that the amplitude signal is inputted to the regulator in the first mode, and the amplitude signal is inputted to the second regulator in the second mode; and
    a second switch for switching connection such that the DC voltage is supplied from the first DC power source to the third input terminal of the power amplifying section in the first mode, and the voltage based on the amplitude signal is supplied from the second regulator to the third input terminal of the power amplifying section in the second mode.

7. The transmitter circuit according to claim 6, wherein the power amplifying section switches the operation mode between the first mode and the second mode, according to a look-up table in which the power information and the operation modes are defined.

8. The transmitter circuit according to claim 6, wherein the power amplifying section switches the operation mode to the first mode when the power information indicates a value less than a predetermined threshold value, and switches the operation mode to the second mode when the power information indicates a value greater than or equal to the predetermined threshold value.

9. The transmitter circuit according to claim 1, further comprising a distortion compensation section for predistorting at least one of the amplitude signal and the phase signal generated by the signal generation section, to compensate for at least one of an AM-PM distortion and an AM-AM distortion which occur in the amplifier circuit.

10. The transmitter circuit according to claim 1, further comprising:
  a temperature measurement section for measuring temperature information of the power amplifying section;
  a look-up table in which the temperature information of the power amplifying section and coefficients corresponding to the temperature information are preset;
  a control section for reading a corresponding one of the coefficients from the look-up table, based on the temperature information measured by the temperature measurement section; and
  a multiplier for multiplying the amplitude signal by the corresponding one of the coefficients having been read by the control section.

11. The transmitter circuit according to claim 1, further comprising:
  a temperature measurement section for measuring temperature information of the power amplifying section;
  a look-up table in which the temperature information of the power amplifying section and coefficients corresponding to the temperature information are preset;
  a control section for reading a corresponding one of the coefficients from the look-up table, based on the temperature information measured by the temperature measurement section; and
  an adder for adding, to the amplitude signal, the corresponding one of the coefficients having been read by the control section.

12. The transmitter circuit according to claim 1, further comprising:
  a temperature measurement section for measuring temperature information of the power amplifying section;
  a look-up table in which the temperature information of the power amplifying section, first coefficients corresponding to the temperature information, and second coefficients corresponding to the temperature information are preset;
  a control section for reading, from the look-up table, a corresponding one of the first coefficients and a corresponding one of the second coefficients, based on the temperature information measured by the temperature measurement section;
  a multiplier for multiplying the amplitude signal by the corresponding one of the first coefficients having been read by the control section; and
  an adder for adding, to the amplitude signal, the corresponding one of the second coefficients having been read by the control section.

13. A communication apparatus comprising:
a transmitter circuit for generating a transmission signal; and
an antenna for outputting the transmission signal generated in the transmitter circuit, wherein
the transmitter circuit is the transmitter circuit according to claim 1.

14. The communication apparatus according to claim 13, further comprising:
a receiver circuit for processing a reception signal received via the antenna; and
an antenna duplexer for outputting, to the antenna, the transmission signal generated in the transmitter circuit, and outputting, to the reception circuit, the reception signal received via the antenna.

* * * * *